United States Patent [19]

Baba et al.

[11] 4,434,408

[45] Feb. 28, 1984

[54] OSCILLATOR HAVING CAPACITOR CHARGING AND DISCHARGING CONTROLLED BY NON-SATURATING SWITCHES

[75] Inventors: Yasuharu Baba, Atsugi; Masashi Takeda, Isehara, both of Japan

[73] Assignee: Sony Corporation, Tokyo, Japan

[21] Appl. No.: 242,395

[22] Filed: Mar. 10, 1981

[30] Foreign Application Priority Data

Mar. 11, 1980 [JP] Japan .................................. 55-30551

[51] Int. Cl.³ ...................... H03K 3/023; H03K 3/282
[52] U.S. Cl. .................................. 331/111; 323/237; 323/258
[58] Field of Search ............................ 331/111, 113 R

[56] References Cited

U.S. PATENT DOCUMENTS 3,904,988  9/1975  Hsiao .................................. 331/111
3,924,202  12/1975  Craft .................................. 331/111

Primary Examiner—Siegfried H. Grimm
Attorney, Agent, or Firm—Hill, Van Santen, Steadman & Simpson

[57] ABSTRACT

An oscillator which includes a DC voltage source, a differential amplifier having a hysteresis characteristics, a current source circuit producing a predetermined constant current, a current sink circuit flowing therein substantially one half of the predetermined constant current, and first and second current switching circuits controlled by the output of the hysteresis amplifier to charge/discharge a capacitor by the current from current source/sink circuits, thereby to produce an output pulse signal.

6 Claims, 3 Drawing Figures

OSCILLATOR HAVING CAPACITOR CHARGING AND DISCHARGING CONTROLLED BY NON-SATURATING SWITCHES

BACKGROUND OF THE INVENTION

1. Field of the Invention

The present invention relates generally to an oscillator, and is directed more particularly to an oscillator suitable for use as a clock signal generator of a switching power source circuit.

2. Description of the Prior Art

In the art, as a clock pulse signal generator used in a switching power source circuit, an oscillator circuit is known in which a switching transistor is turned ON/OFF by the output from a differential amplifier which has a hysteresis characteristic for generating a clock pulse signal.

The switching transistor used in such oscillator circuits, however, is current saturated during the time when it is conductive, and due to the storage time no high frequency oscillating output is generated.

OBJECTS AND SUMMARY OF THE INVENTION

Accordingly, an object of the present invention is to provide an oscillator free from the defects inherent in the prior art oscillator.

Another object of the invention is to provide an oscillator in which a pair of current switches which turn a constant current ON/OFF are employed to generate an oscillating high frequency output.

In accordance with one embodiment of the present invention, an oscillator is provided, which includes:

a DC voltage source;

a differential amplifier having hysteresis characteristics and consisting of first and second transistors, each having input and output electrodes, a feed back circuit connected between an output electrode of one of the first and second transistors and a reference point and first and second loads connected between the output electrodes of the first and second transistors and the DC voltage source, respectively;

a capacitor connected between the input electrode of the first transistor and the reference point;

a current source circuit connected to the DC voltage source and having a main current path producing a predetermined constant current;

a current sink circuit connected to the reference point and having a main current path wherein substantially one half of the predetermined constant current flows;

a first current switching circuit connected between the control terminal of the current source circuit and the connection point of the capacitor with the input electrode of the first transistor and controlled by an output signal of the output electrode of the second transistor; and a second current switching circuit connected between the control terminal of the current source circuit and the reference point through a third load and controlled by an output signal of the control electrode of the first transistor, thereby to produce an output pulse signal across the third load.

The other objects, features and advantages of the present invention will be apparent from the following descriptions taken in conjunction with the attached drawings in which the same references designate the same elements and parts.

DESCRIPTION OF THE PREFERRED EMBODIMENT

In order to better understand the present invention, an example of the prior art oscillator will be first described with reference to FIG. 1.

Figure 1:
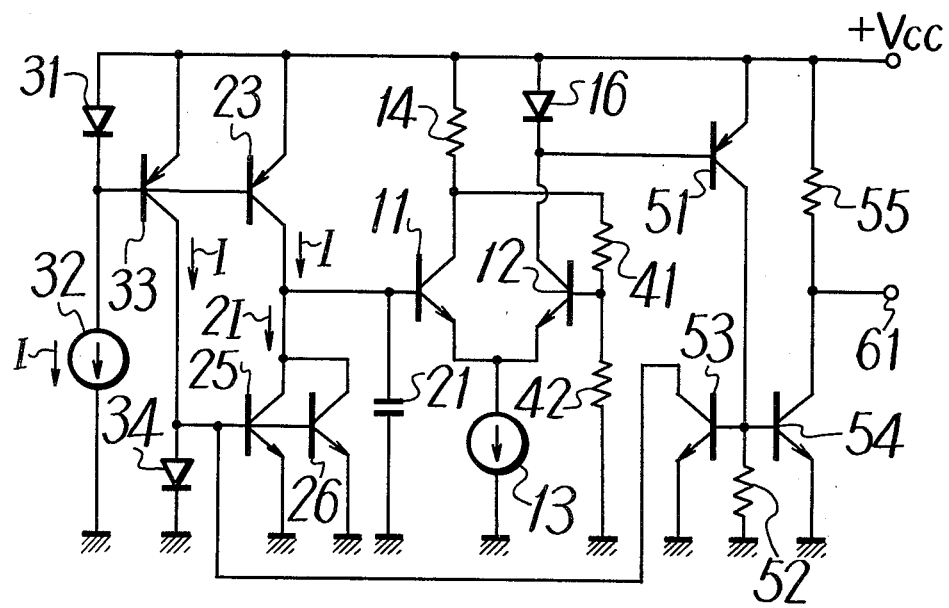
FIG. 1 is a connection diagram showing an example of the prior art oscillator.

In FIG. 1, transistors 11 and 12, which form a differential amplifier, are provided which have their emitters connected together to ground through a constant current source 13. Between the base of the transistor 11 and the ground, there is connected a capacitor 21, and between the base of the transistor 11 and a power source terminal $+V_{cc}$ there is connected a transistor 23 which is used for charging the capacitor 21. Two transistors 25 and 26 have their collector emitter paths connected in parallel to the capacitor 21 for discharging it. The transistor 23 is of a different conductivity type than transistors 25 and 26. That is, in the illustrated example, the transistor 23 is a PNP type, and transistors 25 and 26 are each NPN type.

The transistor 23 together with a diode 31 and a constant current source 32 for a constant current I form a current mirror circuit through which the constant current I flows. A transistor 33 is also provided which together with the diode 31 and constant current source 32 form a current mirror circuit and, through the transistor 33 the constant current I flows. Also, the transistors 25 and 26 together with the transistor 33 and a diode 34 respectively form current mirror circuits through which the constant current I flows, respectively.

A resistor 14 has one end connected to the collector of the transisor 11 and its other end connected to the power source terminal $+V_{cc}$. Series connected resistors 41 and 42 are inserted between the collector of the transistor 11 and the ground. The connection point between the resistors 41 and 42 is connected to the base of the transistor 12. Thus, the differential amplifier consisting of the transistors 11 and 12 has a hysteresis characteristic.

One side of a diode 16 and the base of a transistor 51 are each connected to the collector of the transistor 12, and the other side of the diode 16 is connected to the power source terminal $+V_{cc}$. The transistor 51 has its emitter connected to the power source terminal $+V_{cc}$ and the collector is connected to a resistor 52 and also to the base of a transistor 53 which has its collector connected to the bases of the transistors 25 and 26.

Further by way of example, the collector of the transistor 51 is connected to the base of a transistor 54 which has its collector connected to the power source terminal $+V_{cc}$ through a resistor 55 and is also directly connected to an output terminal 61.

With the prior art oscillator shown in FIG. 1, when the transistor 11 is OFF and the transisor 12 is ON, the transistors 51 and 53 are ON and the transistors 25 and 26 are OFF. At this time, the capacitor 21 is charged by the constant current I through the transistor 23. Now, if it is assumed that the voltage of the power source is taken as $V_{cc}$ and the resistance values of the resistors 14, 41 and 42 as $R_4$, $R_1$ and $R_2$, respectively, the base voltage of the transistor 12 at this time is a relatively high voltage $V_H$ which can be expressed as follows:

$$V_H = \frac{R_2}{R_4 + R_1 + R_2} V_{cc} \tag{1}$$

When the terminal voltage across the capacitor 21 increases linearly and arrives at the voltage $V_H$, the transistor 11 turns ON but the transistor 12 turns OFF.

When the transistor 11 turns ON and the transistor 12 turns OFF, the transistors 51 and 53 turn OFF and the transistors 25 and 26 turn ON, respectively. Thus, the capacitor 21 is discharged by the current I. If the current of the constant current source 13 is taken as $I_0$, the base voltage of the transistor 12 becomes a relatively low voltage $V_L$, which is low as compared with the voltage $V_H$ and can be expressed as follows:

$$V_L = \frac{R_2}{R_1 + R_2} (V_{cc} - I_0 \cdot R_4) \tag{2}$$

When the terminal voltage across the capacitor 21 decreases linearly and arrives at the voltage $V_L$, the transistor 11 turns OFF but the transistor 12 turns ON.

By the repetition of the above operations, a triangular waveform voltage is generated across the capacitor 21 and an oscillating output with a rectangular waveform is obtained at the output terminal 61.

With the above prior art oscillator, when the transistor 11 is OFF and the transistor 12 is ON, the transistors 53 and 54 are saturated. As a result, due to the scattering of the storage time and fall time of the transistors 53 and 54 and also the temperature variation thereof, defects are caused such that the frequency or duty cycle of the oscillating output is scattered and also is varied by temperature fluctuations.

In view of the drawbacks encountered in the prior art oscillator, the oscillator according to the present invention which will oscillate at a constant frequency and with a stable duty cycle will be described hereinabelow.

Now, an example of the oscillator according to the present invention will be described with reference to FIG. 2, in which the references which are the same as those of FIG. 1 designate the same elements and parts and their detailed description will be omitted for the sake of brevity.

Figure 2:
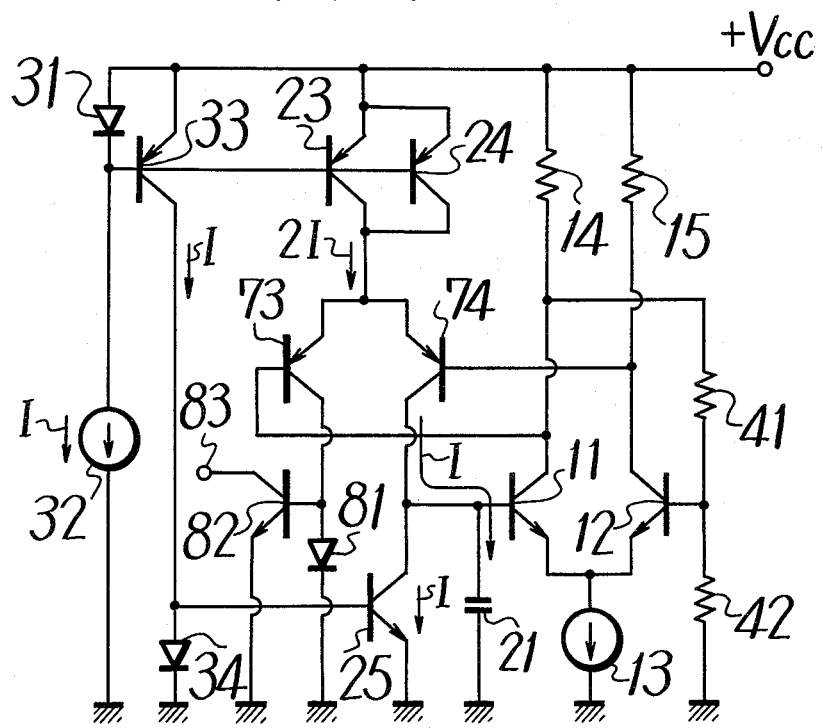
FIG. 2 is a connection diagram showing an example of the oscillator according to the present invention.

In the example of the invention shown in FIG. 2, the collectors of the transistors 11 and 12 which form the differential amplifier are respectively connected to the bases of transistors 73 and 74 which are each of a PNP type in the illustrated example. The emitters of the transistors 73 and 74 are connected together in a differential form. Between the power source terminal of $+V_{cc}$ and the connection point of the emitters of the transistors 73 and 74, there are connected two transistors 23 and 24 which serve as a constant current source for delivering a constant current 2I. In this case, the current I thus flows through each of the transistors 23 and 24.

The collector of the transistor 74 is connected to the base of the transistor 11. In parallel with the capacitor 21, is connected a transistor 25 which serves as a current sink for absorbing one half of the current. Since the transistor 25 and the diode 34 are connected to form the current mirror circuit as set forth previously, the current I flows through the transistor 25. Resistors 14 and 15 are respectively connected between the collectors of the transistors 11 and 12 and the power source terminal of $+V_{cc}$. The connection of the resistors 41 and 42 to the differential amplifier which is formed of the transistors 11 and 12, causes the differential amplifier to have the hysteresis characteristic as does the example of FIG. 1.

Further, between the collector of the transistor 73 and the ground there are connected a diode 81 and a transistor 82 which form a current mirror circuit. An output terminal 83 is led out from the collector of the transistor 82.

With the oscillator of the invention shown in FIG. 2, when the transistor 11 is OFF and the transistor 12 is ON, the transistor 73 is OFF and the transistor 74 is ON. Thus, a total current of 2I flows from the transistors 23 and 24 to the transistor 74, and current I of the total current 2I flows to the transistor 25 and the remaining current I flows to the capacitor 21. Thus, the capacitor 21 is charged by the current I. At this time, the base voltage of the transistor 12 will be the above-mentioned relatively high voltage $V_H$. When the terminal voltage across the capacitor 21 increases linearly and reaches the voltage $V_H$, the transistor 11 turns ON while the transistor 12 turns OFF.

When the transistor 11 is ON and the transistor 12 is OFF, the transistor 73 turns ON and the transistor 74 turns OFF. Thus, the current I is discharged from the capacitor 21 through the transistor 25. At this time, the base voltage of the transistor 12 becomes the above-mentioned relatively low voltage $V_L$. When the terminal voltage across the capacitor 21 linearly decreases and arrives at the low voltage $V_L$, the transistor 11 turns OFF and the transistor 12 turns ON. As a result, the transistor 73 turns OFF and the transistor 74 turns ON.

By repetition of the operations described above, with the oscillator of the invention, a voltage with a triangular waveform is generated across the capacitor 21 and an oscillating current output of a rectangular waveform is obtained at the output terminal 83.

According to the example of the invention shown in FIG. 2, since the transistors 73 and 74 each operate as a current switch, it is possible that the transistors 73 and 74 are not saturated and hence the influence due to the storage time of the transistors 73 and 74 is removed. As a result, the frequency of the oscillating output can be selected to be high and hence the duty cycle becomes stable.

With the example of the invention shown in FIG. 2, it was ascertained that when the circuit elements are so selected that the oscillating frequency is 1 MHz, the duty cycle will fall within the range of ±2% with 50% as its center.

Further, it is easy to provide an oscillating output with a high frequency even though the transistors 73 and 74 forming the current switches are each formed of a lateral transistor because they operate in the vicinity of the cut-off frequency.

When the PNP-type transistors and the NPN-type transistors in the oscillator are formed on the same semiconductor substrate, if the PNP-type transistors, for example, are each made as a lateral transistor, the diffusion process can be reduced and hence the manufacturing becomes simple.

Now, a switching type stabilized power source circuit, in which the example of the oscillator according to the invention shown in FIG. 2 is used as the clock pulse signal oscillator for generating a clock pulse signal, will be described with reference to FIG. 3.

Figure 3:
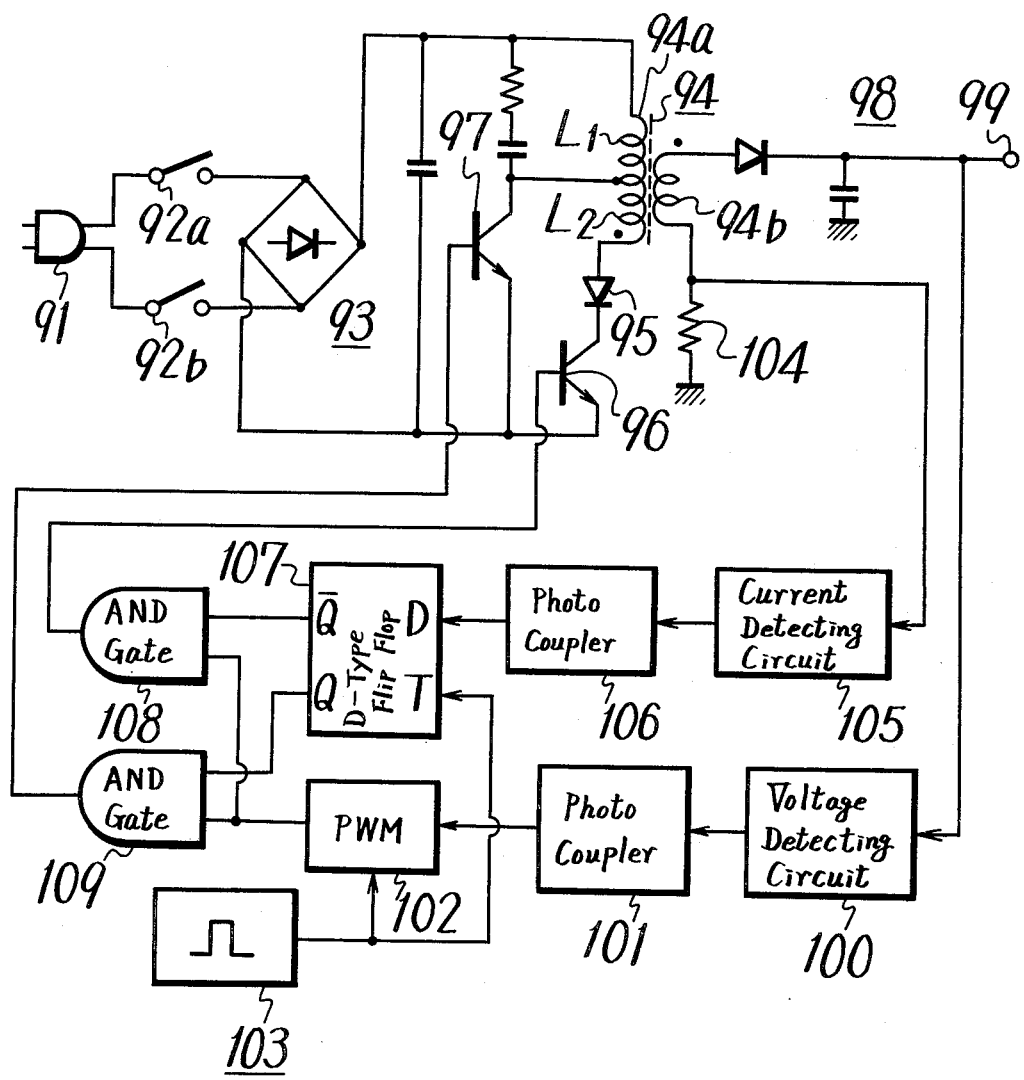
FIG. 3 is a circuit diagram showing, partially in block, an example of the switching type power source circuit in which the oscillator of the invention is employed.

In FIG. 3, 91 denotes a power source plug to which the commercial AC voltage is applied. The commercial AC voltage applied to the power source plug 91 is supplied through power switches 92a and 92b to a rectifier circuit 93 and therein rectified and smoothed to a DC voltage. This DC voltage is supplied through a primary winding 94a of a transformer 94 and through a reverse current blocking diode 95 to an NPN-type transistor 96 which forms a first switching element. The DC voltage appearing at a middle tap of the primary winding 94a is applied to an NPN-type transistor 97 which forms a second switching element. In this case, it should be assumed that the inductance value of a part of the primary winding 94a from its end to the middle tap is taken as $L_1$ and the inductance value of a part from the middle tape to the other end of the primary winding 94a is taken as $L_2$, respectively.

The AC voltage induced across a secondary winding 94b of the transformer 94 is applied to a rectifier circuit 98 is rectified and smoothed to a DC voltage which is delivered to an output terminal 99. The DC voltage appearing at the output terminal 99 is detected by a voltage detecting circuit 100 and the detected output therefrom is supplied through an insulating and separating coupler 101 such as a photo coupler or the like to a PWM (pulse width modulator) 102, which will generate a switching signal, as a modulating signal. This PWM 102 is also supplied with, as a carrier, a clock pulse signal of, for example, 100 KHz from a clock pulse oscillator 103 which may be the oscillator shown in FIG. 2 which frequency-divides the clock pulse to provide the clock pulse signal of 100 KHz. The pulse width of the switching signal obtained at the output of PWM 102 is varied so that the DC voltage appearing at the output terminal 99 is stabilized at a desired constant value.

In the power source circuit shown in FIG. 3, a resistor 104 which is low in resistance is used for current detection and is connected between the secondary winding 94b of the transformer 94 and ground, and the voltage drop across the resistor 104 is supplied to a current detecting circuit 105. The current detecting circuit 105 delivers the detected output which becomes low level "0" when the voltage drop across the resistor 104 i.e. the output current from the output terminal 99 is lower than a predetermined value or a threshold value $I_{TH}$, but becomes a high level "1" when the output current is higher than the predetermined value $I_{TH}$. The detected output from the current detecting circuit 105 is supplied through an insulating and separating coupler 106 such as a photo coupler or the like to a control circuit such as a D-type flip-flop circuit 107 on its D-input terminal a trigger input terminal T is supplied with the clock pulse from the clock pulse oscillator 103. The output at a $\overline{Q}$-output terminal of the D-type flip-flop circuit 107 is fed, as a gate signal, to one of the input terminals of an AND gate circuit 108 and the other input terminal of the gate 108 is supplied with the switching signal from the PWM 102. The switching signal passed through the AND gate circuit 108 is fed to the base of the transistor 96.

The output obtained at a Q-output terminal of the D-type flip-flop circuit 107 is fed, as a gate signal, to one of the input terminals of an AND gate circuit 109 and the other input terminal of gate 109 is supplied with the switching signal from the PWM 102. The switching signal which passes through the AND gate circuit 109 is fed to the base of the transistor 97.

According to the power source circuit shown in FIG. 3, when a load to be connected to the output terminal 99 is small, the output current appearing at the output terminal 99 will be reduced. When the reduced current is lower than the predetermined value $I_{TH}$ of the current detecting circuit 105, the detected output becomes "0". Thus, the output appearing at the $\overline{Q}$-output terminal of the D-type flip-flop circuit 107 becomes "0" in synchronism with the clock pulse from the clock pulse generator 103, so that the transistor 97 turns OFF.

At this time, however, the output at the $\overline{Q}$-output terminal of the D-type flip-flop circuit 107 becomes "1" so that the switching signal from the PWM 102 is fed through the AND gate circuit 108 to the base of the transistor 96. Thus, the input DC voltage is subjected to the switching by the transistor 96 and hence an output DC voltage $V_O$ is delivered to the output terminal 99. In this case, since an input DC voltage $V_i$ from the rectifier circuit 93 is applied to all of the primary winding 94A of the transformer 94 i.e. the series connection of the inductances having inductance values $L_1$ and $L_2$, if it is assumed that the duty cycle ratio of the switching signal is D, the period as $T_p$ and the value of the load as $R_L$, the output DC voltge $V_O$ will be expressed as follows:

$$V_O = V_i \cdot D \sqrt{\frac{R_L \cdot T_p}{2(L_1 + L_2)}} \qquad (3)$$

Thus, the maximum output power $P_0$ is expressed as follows:

$$P_0 = \frac{V_O^2}{R_L} = \frac{V_i^2 \cdot D^2 \cdot T_p}{2(L_1 + L_2)} \qquad (4)$$

Accordingly, if the inductance values $L_1$ and $L_2$ are selected preliminarily, respectively, the output DC voltage $V_O$ can be obtained which is sufficiently stable for load variations even when the load is small.

When the load connected to the output terminal 99 is large, the output current appearing at the output terminal 99 becomes large. If this output current exceeds the predetermined value $I_{TH}$ of the current detecting circuit 105, the detected output therefrom becomes "1". Thus, the output at the $\overline{Q}$-output terminal of the D-type flip-flop circuit 107 becomes "0" in synchronism with the clock pulse from the clock pulse oscillator 103. Therefore, the output from the AND gate circuit 108 becomes "0" so that the transistor 96 turns OFF. At this time, however, since the output at the Q-output terminal of the D-type flip-flop circuit 107 becomes "1", the switching signal from the PWM 102 is fed to the base of the transistor 97 through the AND gate circuit 109 to make the transistor 97 operative. Thus, the portion of the primary winding 94a of the transformer 94 from the one end to the middle tap thereof is used and at this time the inductance value of this part is $L_1$. THus, the maximum output power $P_0$ at this time is expressed as follows:

$$P_0 = \frac{V_i^2 \cdot D^2 \cdot T_p}{2L_1} \qquad (5)$$

In this case, the inductance value becomes small as compared with the case where the load is small, so that as will be apparent from the equations (4) and (5) the maximum output power $P_0$, which can be obtained at the output terminal 99, becomes large. In other words, even if a larger output is derived from the power source circuit, the DC voltage obtained at the output terminal thereof is stabilized, and even if the load is large the DC voltage is sufficiently stable for the load fluctuations.

With the above-described switching type stabilized power source circuit, if the switching frequency is selected to be high, the efficiency thereof will be high. Therefore, if the oscillator of the invention shown in FIG. 2 is used as the clock pulse oscillator, a power source circuit with high efficiency is provided.

The above description is given for a single preferred embodiment of the present invention. However, it will be apparent that many modifications and variations could be effected by one skilled in the art without departing from the spirit or scope of the novel concepts of the present invention so that the spirit or scope of the invention should only be determined by the appended claims.

We claim as our invention:
1. An oscillator comprising:
   (a) a DC voltage source;
   (b) a differential amplifier having a hysteresis characteristic and consisting of first and second transistors, each having input and output electrodes, a feedback circuit connected between said output electrode of said first transistor and said input electrode of said second transistor, and first and second loads connected between the output electrodes of said first and second transistors and said DC voltage source, respectively;
   (c) a capacitor means connected between the input electrode of said first transistor and a reference point;
   (d) current source means connected to said DC voltage source and having a main current path producing a predetermined constant current;
   (e) current sink means having a main current path connected between the input electrode of said first transistor and said reference point and substantially one-half of said predetermined constant current flowing through said current sink means;
   (f) first current switching means connected between the main current path of said current source means and the connection point of said capacitor means with the input electrode of said first transistor and controlled by an output signal of the output electrode of said second transistor; and
   (g) second current switching means connected between the main current path of said current source means and said reference point through a third load and controlled by an output signal of the output electrode of said first transistor, thereby to produce an output pulse signal across said third load.

2. An oscillator according to claim 1, in which said first current switching means comprises a third transistor having an input electrode connected to the output electrode of said second transistor, the main current path of said third transistor is connected between the main current path of said current source means and the connection point of said capacitor means with the input electrode of said first transistor.

3. An oscillator according to claim 2, in which said second current switching means comprises a fourth transistor having an input electrode connected to the output electrode of said first transistor, the main current path of said fourth transistor is connected between the main current path of said current source means and said third load.

4. An oscillator according to claim 3, in which said current source means comprises fifth and sixth transistors, each having an input electrode connected to each other, the main current paths of which are connected in parallel to each other and between said DC voltage source and the connection point of said third and fourth transistors; first diode means connected between said DC voltage source and a further current sink means; and circuit means for connecting the connection point of said first diode means with said further current sink means to the input electrodes of said fifth and sixth transistors.

5. An oscillator according to claim 4, in which said current sink means comprises a seventh transistor having an input electrode, the main current path of which is connected in series with the main current path of said third transistor; an eighth transistor having an input electrode connected to the connection point of said first diode means with said further current sink means, the main current path of said eighth transistor is connected between said DC voltage source and said reference point through second diode means; and circuit means for connecting the connection point of said eighth transistor with said second diode means to the input electrode of said seventh transistor.

6. An oscillator according to claim 1, in which the output pulse signal across said third load is used for a clock pulse signal of a switching type power supply circuit.

* * * * *